US00RE42043E

(19) United States
(12) Reissued Patent
Andre

(10) Patent Number: US RE42,043 E
(45) Date of Reissued Patent: Jan. 18, 2011

(54) RADIOFREQUENCY TRANSMITTER WITH A HIGH DEGREE OF INTEGRATION AND POSSIBLY WITH SELF-CALIBRATING IMAGE DELETION

(76) Inventor: Eric Andre, 18 rue Lachmann, Grenoble (FR), 38000

(21) Appl. No.: 11/318,388

(22) Filed: Dec. 23, 2005

Related U.S. Patent Documents

Reissue of:
(64) Patent No.: 6,668,024
Issued: Dec. 23, 2003
Appl. No.: 09/518,944
Filed: Mar. 6, 2000

(30) Foreign Application Priority Data

Mar. 23, 1999 (FR) ..... 99 03768

(51) Int. Cl.
*H04L 27/38* (2006.01)

(52) U.S. Cl. ..... 375/298
(58) Field of Classification Search ..... 375/261, 375/298
See application file for complete search history.

(56) References Cited

U.S. PATENT DOCUMENTS 5,351,016 A 9/1994 Dent
5,748,623 A 5/1998 Sawahashi et al.
6,298,096 B1 10/2001 Burgin

FOREIGN PATENT DOCUMENTS

EP 0 692 867 1/1996
WO 98 11665 * 3/1998

OTHER PUBLICATIONS

French Search Report; French Application No. 9903768; Prepared Nov. 26, 1999.*

* cited by examiner

*Primary Examiner*—Kevin Y Kim

(57) ABSTRACT

A radio frequency transmitter, of the type supplied with two signals in baseband and in quadrature, I(nT) and q(nT), which are images from two binary streams representing information to be transmitted, 1) provides a first transposition into the digital domain, at an intermediate frequency $\omega_0$, for the baseband signals and generates, by combination, two signals of intermediate frequency in quadrature, 2) provides a second transposition into the analog domain, after multiplication by a frequency $\omega_1$, followed by a summation of the two signals at intermediate frequency and in quadrature, in such a way that a resultant signal is generated which is found finally around a frequency $\omega_2$, where $\omega_2=\omega_0+\omega_1$. In an advantageous variant, the radio frequency transmitter additionally digitally compensates gain and phase imperfections of the direct conversion.

28 Claims, 1 Drawing Sheet

FIG.1
Amended
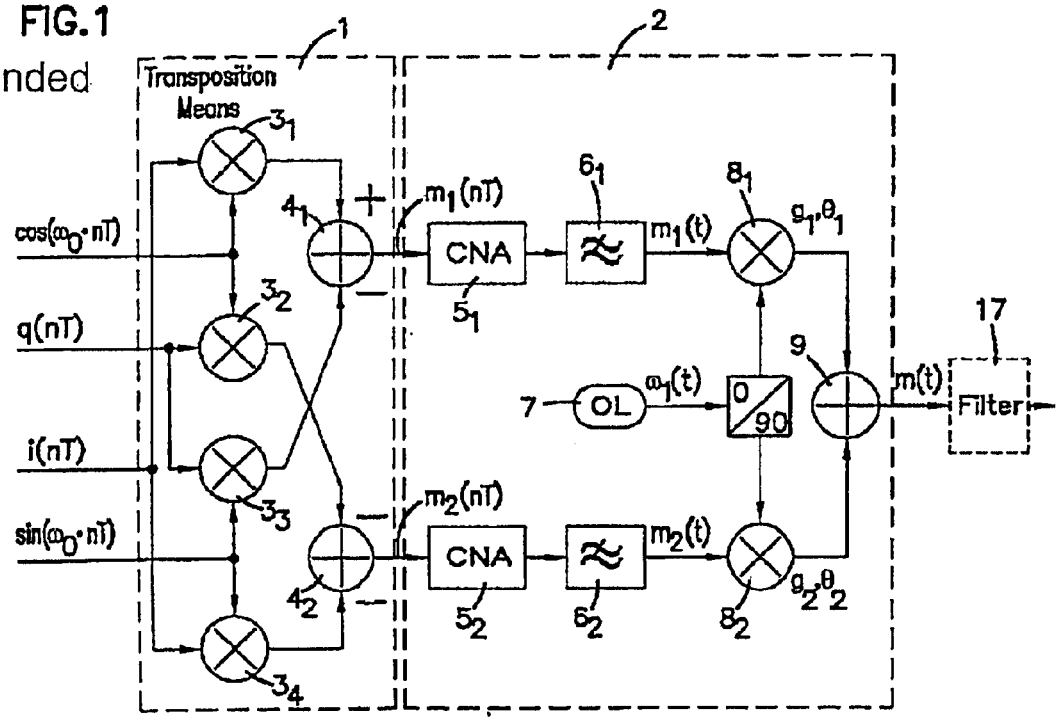

RADIOFREQUENCY TRANSMITTER WITH A HIGH DEGREE OF INTEGRATION AND POSSIBLY WITH SELF-CALIBRATING IMAGE DELETION

Matter enclosed in heavy brackets [ ] appears in the original patent but forms no part of this reissue specification; matter printed in italics indicates the additions made by reissue.

FIELD OF THE INVENTION

The field of the invention is that of transmitting signals by a frequency channel.

BACKGROUND

It will be recalled that transmission of a signal by a frequency channel more and more often calls upon digital modulation, the main advantage of which is that it permits the use of signal processing algorithms. The purpose of these algorithms is to increase the strength of the signal to be transmitted relative to the propagation channel.

SUMMARY

More precisely, the invention relates to a radiofrequency transmitter of the type supplied by two signals (or components) in baseband and in quadrature i(t) and q(t), which are images of two binary streams representing a piece of information to be transmitted. In effect, whatever the type of digital modulation, the signal to be transmitted m(t) can be written:

$m(t)=i(t)\cdot\cos(\omega t)-q(t)\cdot\sin(\omega t)$, where $\omega$ ($=2\pi f$) is the transmission frequency of the signal (also called the carrier frequency).

In the state of the technology, different types of radiofrequency transmitter are known, each based on a distinct architecture. The most widely known are the radiofrequency transmitter with frequency transposition, the radiofrequency transmitter with direct conversion and the radiofrequency transmitter with a phase locked loop. Their respective disadvantages will now be discussed.

The radiofrequency transmitter with frequency transposition which permits transposition to an intermediate frequency FI, requires the use of selective pass band filters, so as to reject the image frequency of the wanted signal to be transmitted. This first type of radiofrequency transmitter provides good performance, thanks to frequency transposition into the digital domain. However, the requirement to use high performance filters restricts its degree of integration onto silicon.

The radiofrequency transmitter with direct conversion has the most simple architecture and offers a high degree of integration. Its weak point is its high sensitivity to the performance of the elements that make it up. In particular, it is recommended that any leakage from the conversion oscillator via the mixer be avoided or that provision is made for perfect quadrature of the sine and cosine signals. These imperatives are often difficult to keep to.

The radiofrequency transmitter with a phase locked loop offers numerous advantages, such as the ability to do away with RF filters thanks to the pass band characteristic of the phase locked loop or PLL. The requirement to have the signals strictly in quadrature is also avoided. Nevertheless, these results are only possible if the voltage controlled oscillator or VCO included in the PLL provides high performance. This is not the case with integrated VCOs. Consequently, the PLL radiofrequency transmitter does not enable a high level of integration to be provided.

Therefore in a general way, these three types of known architecture offer a necessary compromise between integration, consumption and complexity. In other words, none of these three known solutions is entirely satisfactory.

A particular objective of the invention is to remedy these various disadvantages of the state of the technology.

More precisely, one of the objectives of this invention is to provide a radiofrequency transmitter providing good precision and offering a very high degree of integration on silicon.

Another objective of the invention is to provide such a radiofrequency transmitter that has very low sensitivity to the imperfections in the elements that make it up.

Another objective of the invention is to provide such a radiofrequency transmitter that enables one to avoid degradation of the wanted signal.

A complementary objective of the invention is to provide such a radiofrequency transmitter which is simple and is not any more complex than the known architectures.

Another objective of the invention is to provide such a radiofrequency transmitter that allows one to generate a resultant signal that has an image frequency that is sufficiently weak to be able to be suppressed by a filter with relaxed constraints (this filter thus being capable of being integrated).

In an embodiment variation, another objective of the invention is to provide a radiofrequency transmitter that does not give an image frequency, the image frequency at the output being completely attenuated, in an automatic fashion, by a self-calibrating system that compensates for imperfections both in gain and in phase.

These various objectives as well as others that will become apparent below, have been achieved according to the invention by a radiofrequency transmitter, of the type supplied with two signals in baseband and in quadrature, i(nT) and q(nT), which are images from two binary streams representing information to be transmitted, the radiofrequency transmitter comprising:

means of transposition into an intermediate frequency and of digital processing, that provide a first transposition into the digital domain, at an intermediate frequency $\omega_0$, for said base band signals, and generating, by combination, two signals at the intermediate frequency and in quadrature;

means of direct conversion, providing a second transposition into the analog domain, after multiplication by a frequency $\omega_1$, followed by a summation, of said two signals at the intermediate frequency and in quadrature, in a way that generates a resultant signal which is finally modulated around a frequency $\omega_2$, where $\omega_2=\omega_0+\omega_1$.

Therefore, this invention proposes an original architecture for a radiofrequency transmitter that combines the architectures with direct conversion and with frequency transposition, and which provides, in addition, means of digital processing, which provide preprocessing that permits attenuation at the output of the image frequency introduced by the means of transposition into an intermediate frequency. Hence, this new architecture combines the main advantage of the radiofrequency transmitter with direct conversion (no image frequency) with that of the radiofrequency transmitter with frequency transposition (no degradation of the wanted signal), while at the same time avoiding their disadvantages (sensitivity to imperfections, high performance filter).

In the description that follows, it will be shown that this invention operates perfectly if the two channels of the direct conversion means have the same gain and if the sines and cosines supplied by the oscillator included in the direct conversion means do not suffer from poor quadrature forming.

It will also be shown that, in the contrary case, a low power interference signal appears at the image frequency, but the wanted signal is not degraded in practice. Consequently, it is not essential to use, at the output, a filter attenuating the image frequency of the wanted signal. In any case, when the performance demanded from the transmission chain requires the use of such a filter, the latter can have relaxed constraints since the image frequency is very attenuated and can therefore be easily suppressed. In other words, the quality of the transmitted signal can be preserved without the need for high image filtering constraints. In certain cases, if the constraints are sufficiently relaxed, the image filter may possibly also be integrated with it.

It should be noted that the first frequency transposition and the signal processing are carried out in the digital domain, which enables one to benefit from the precision and the high degree of integration (on silicon for example).

It will also be noted that the radiofrequency transmitter according to the invention has a high degree of integration (for example, on silicon) and advantageously can even be entirely produced in the form of an integrated circuit. In effect, the means of direct conversion are known for their high degree of silicon integration. Furthermore, the level of integration of the means of transposition into an intermediate frequency can be relatively high since it is not necessary to use high performance filters. Finally, the digital processing means can be reduced to an assembly of elements currently used in integrated systems on silicon, and notably in transmitters with frequency transposition. This assembly of elements comprises, for example, a Numerically Controlled Oscillator or NCO and linear operators (multipliers and adders).

In addition, the extra complexity compared with a direct conversion architecture is negligible.

Finally, passing through a first intermediate frequency $\omega_0$ generated in the digital domain makes possible the attenuation of any possible leak from the conversion oscillator via the mixers.

In one advantageous embodiment of the invention, said radiofrequency transmitter additionally comprises means of digitally compensating for imperfections in gain and in phase in said means of direct conversion.

Hence, by ensuring that at the output of the radiofrequency transmitter, the signal at the image frequency is completely attenuated, the performance of the radiofrequency transmitter according to the invention is optimized and the resulting transmitted signal has characteristics close to the ideal case. Thanks to this self-calibrating technique of image annulment, the errors introduced by the analog part (that is to say the means of direct conversion) sensitive to the imperfections, are compensated for in the digital domain.

It is important to note that in this particular embodiment, no image frequency filter whatsoever is required. This new architecture for a radiofrequency transmitter therefore operates independently of the chosen carrier frequency and is therefore particularly suitable for multi-standard systems of radiocommunications. Among the standards possible, one may mention only by way of examples, the Global System for Mobile communications or GSM, the Digital Cellular System 1800 MHz or DCS 1800, the Personal Communication System or PCS 1900, Digital European Cordless Telecommunications or DECT or the Universal Mobile Telecommunication System or UMTS etc.

Preferably, said analog/digital conversion means have a working frequency substantially identical to the working frequency of the digital/analog conversion means in said means of direct conversion.

In a preferred way, said means of digital compensation are included in said integrated circuit. Hence, the radiofrequency transmitter according to this invention can be entirely integrated, for example on silicon.

BRIEF DESCRIPTION OF THE DRAWINGS

Other characteristics and advantages of the invention will become apparent on reading the following description of two preferred embodiments of the invention, given by way of examples for information purposes and being non-limitative and accompanied by the appended drawings in which:

FIG. 1 shows a general diagram of a first embodiment of a radiofrequency transmitter according to this invention with "simple" image annulment.

DETAILED DESCRIPTION

Figure 2:
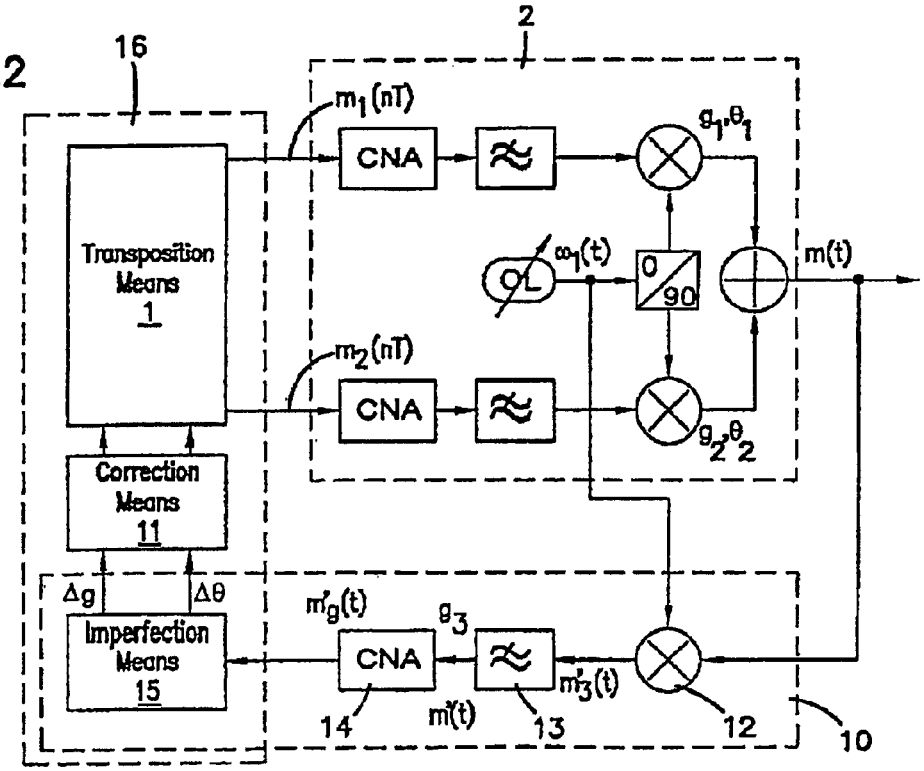
FIG. 2 shows a general diagram of a second embodiment of a radiofrequency transmitter according to this invention with "self-calibrating" image annulment.

Therefore the invention relates to a radiofrequency transmitter of the type supplied with two digital signals in baseband and in quadrature i(nT) and q(nT), which are images of two binary streams representing information to be transmitted. T is the sample period.

In a traditional way, and whatever the digital modulation used, one is seeking to provide a signal to be transmitted m(t) that can be written:

$$m(t)=i(t)\cdot\cos(\omega t)-q(t)\cdot\sin(\omega t).$$

where $\omega$ ($=2\pi f$), the frequency of transmission of the signal (also called the carrier frequency).

1. FIRST EMBODIMENT: "SIMPLE" IMAGE ANNULMENT

1.1 PRESENTATION OF THE ARCHITECTURE

A first embodiment of a radiofrequency transmitter according to this invention will now be described making reference to FIG. 1.

In this first embodiment, the radiofrequency transmitter comprises means 1 of transposition into an intermediate frequency and of digital processing and means 2 of direct conversion.

The means 1 of transposition into an intermediate frequency and of digital processing generate two signals $m_1(t)$ and $m_2(t)$ at an intermediate frequency $\omega_0$ and in quadrature. They comprise:

- a numerically controlled oscillator NCO (not shown) at an intermediate frequency $\omega_0$, supplying the following signals: $\cos(\omega_0\cdot nT)$ and $\sin(\omega_0\cdot nT)$;
- four multipliers $\mathbf{3}_1$ to $\mathbf{3}_4$; and
- two adders $\mathbf{4}_1$ to $\mathbf{4}_2$.

The multipliers $\mathbf{3}_1$ to $\mathbf{3}_4$ and the adders $\mathbf{4}_1$ and $\mathbf{4}_2$ are fitted in such a way that the signals $m_1(nT)$ and $m_2(nT)$ are of the form:

$$m_1(nT)=i(nT)\cdot\cos(\omega_0\cdot nT)-q(nT)\cdot\sin(\omega_0\cdot nT)$$

$$m_2(nT)=-i(nT)\cdot\sin(\omega_0\cdot nT)-q(nT)\cdot\cos(\omega_0\cdot nT)$$

The means 2 of direct conversion generate a resultant signal m(t). They comprise:

on each of the two channels in quadrature, a digital/analog converter (CNA) $5_1$, $5_2$ and a high-stop filter $6_1$, $6_2$, that permits the conversion of the two digital signals $m_1(nT)$ and $m_2(nT)$ into two analog signals $m_1(t)$ and $m_2(t)$;

a conversion oscillator 7 at a transmission frequency $\omega_1$, supplying the following signals: $\cos(\omega_1 \cdot t)$ and $\sin(\omega_1 \cdot t)$;

two multipliers $8_1$ and $8_2$;

one adder 9.

The multipliers $8_1$ and $8_2$ and the adder 9 are fitted in such a way that the resultant signal m(t) is of the form:

$$m(t)=g_1 \cdot m_1(t) \cdot \cos(\omega_1 t+\theta_1)+g_2 \cdot m_2(t) \cdot \sin(\omega_1 t+\theta_2)$$

where $g_1$ and $g_2$ are the respective gains of the two channels in quadrature of the means 2 of direct conversion, and $\theta_1$ and $\theta_2$ are the respective phase shifts of the two channels in quadrature of the means 2 of direct conversion.

As may be found in detail in the description below, it is shown that the resultant signal is finally modulated around a frequency $\omega_2(=\omega_0+\omega_1)$.

Optionally, a filter 17 at the image frequency $\omega_2(=\omega_0+\omega_1)$, can be placed at the output from the radiofrequency transmitter. This filter 17 may possibly also be included in the integrated circuit in which form the radiofrequency transmitter is produced.

1.2 DESCRIPTION OF THE IDEAL CASE

Therefore, the principle consists of generating two signals $m_1(t)$ and $m_2(t)$ made up of the two channels in quadrature i(t) and q(t).

$$m_1(t)=i(t) \cdot \cos(\omega_0 t)-q(t) \cdot \sin(\omega_0 t)$$

$$m_2(t)=-i(t) \cdot \sin(\omega_0 t)-q(t) \cdot \cos(\omega_0 t) \tag{2}$$

where $\omega_0(=2\pi f_0)$ is the first intermediate frequency generated in the digital domain.

Next, the means 2 of direct conversion transpose the two signals around the carrier frequency $\omega_1$ by multiplying them by $\sin(\omega_1 t+\phi)$ and $\cos(\omega_1 t+\phi)$.

The resultant signal m(t) is written in the following way:

$$m(t)=m_1(t) \cdot \cos(\omega_1 t+\phi)+m_2(t) \cdot \sin(\omega_1 t+\phi)=i(t) \cdot \cos(\omega_0 t+\omega_1 t+\phi)-q(t) \cdot \sin(\omega_0 t+\omega_1 t+\phi) \tag{3}$$

$$m(t)=i(t) \cdot \cos(\omega_2 t+\phi)-q(t) \cdot \sin(\omega_2 t+\phi) \tag{4}$$

A signal is obtained modulated around the carrier $\omega_2=\omega_0+\omega_1$, the particular feature of which is not to have an image frequency around $\omega_1$. The resultant formula in equation (4) is verified for the ideal case where the transmitter with direct conversion has perfect characteristics. Unfortunately, this is rarely the case.

1.3 DESCRIPTION OF THE REAL CASE

Taking the imperfections into account, the resultant transmitted signal m(t) is written:

$$m(t)=g_1 \cdot m_1(t) \cdot \cos(\omega_1 t+\theta_1)+g_2 \cdot m_2(t) \cdot \sin(\omega_1 t+\theta_2) \tag{5}$$

Equation (2) enables one to write equation (5) that includes i(t) and q(t):

$$m(t)=i(t) \cdot [g_1 \cdot \cos \omega_0 t \cdot \cos(\omega_1 t+\theta_1)-g_2 \cdot \sin \omega_0 t \cdot \sin(\omega_1 t+\theta_2)]$$

$$-q(t) \cdot [g_1 \cdot \sin \omega_0 t \cdot \cos(\omega_1 t+\theta_1)+g_2 \cdot \cos \omega_0 t \cdot \sin(\omega_1 t+\theta_2)]$$

$$m(t)=\frac{i(t)}{2} \cdot \left\{ \begin{array}{l} g_1[\cos(\omega_0 t-\omega_1 t-\theta_1)+\cos(\omega_0 t+\omega_1 t+\theta_1)]- \\ g_2[\cos(\omega_0 t-\omega_1 t-\theta_2)-\cos(\omega_0 t+\omega_1 t+\theta_2)] \end{array} \right\} - \frac{q(t)}{2} \cdot \left\{ \begin{array}{l} g_1[\sin(\omega_0 t-\omega_1 t-\theta_1)+\sin(\omega_0 t+\omega_1 t+\theta_1)]- \\ g_2[\sin(\omega_0 t-\omega_1 t-\theta_2)-\sin(\omega_0 t+\omega_1 t+\theta_2)] \end{array} \right\} \tag{6}$$

$$m(t)=\frac{i(t)}{2} \cdot \left\{ \begin{array}{l} g_1 \cdot \cos(\omega_0 t-\omega_1 t-\theta_1)-g_2 \cdot \cos(\omega_0 t-\omega_1 t-\theta_2)+ \\ g_1 \cdot \cos(\omega_0 t+\omega_1 t+\theta_1)+g_2 \cdot \cos(\omega_0 t+\omega_1 t+\theta_2) \end{array} \right\} - \frac{q(t)}{2} \cdot \left\{ \begin{array}{l} g_1 \cdot \sin(\omega_0 t-\omega_1 t-\theta_1)-g_2 \cdot \sin(\omega_0 t-\omega_1 t-\theta_2)+ \\ g_1 \cdot \sin(\omega_0 t+\omega_1 t+\theta_1)+g_2 \cdot \sin(\omega_0 t+\omega_1 t+\theta_2) \end{array} \right\}$$

In order to simplify the result described by equation (6) we can replace:

$$\left. \begin{array}{l} \theta_1=\theta-\frac{\Delta\theta}{2} \\ \theta_2=\theta+\frac{\Delta\theta}{2} \end{array} \right\} \text{with } \theta=\frac{\theta_1+\theta_2}{2} \text{ and} \tag{7}$$

$$\left. \begin{array}{l} g_1=g-\frac{\Delta g}{2} \\ g_2=g+\frac{\Delta g}{2} \end{array} \right\} \text{with } g=\frac{g_1+g_2}{2}$$

which means that m(t) can be expressed in the form:

$$m(t)=\frac{i(t)}{2} \cdot \left\{ \begin{array}{l} g \cdot \left[\cos\left(\omega_0 t-\omega_1 t-\theta+\frac{\Delta\theta}{2}\right)-\cos\left(\omega_0 t-\omega_1 t-\theta-\frac{\Delta\theta}{2}\right)\right]- \\ \frac{\Delta g}{2} \cdot \left[\cos\left(\omega_0 t-\omega_1 t-\theta+\frac{\Delta\theta}{2}\right)+\cos\left(\omega_0 t-\omega_1 t-\theta-\frac{\Delta\theta}{2}\right)\right]+ \\ g \cdot \left[\cos\left(\omega_0 t+\omega_1 t+\theta-\frac{\Delta\theta}{2}\right)+\cos\left(\omega_0 t+\omega_1 t+\theta+\frac{\Delta\theta}{2}\right)\right]- \\ \frac{\Delta g}{2} \cdot \left[\cos\left(\omega_0 t+\omega_1 t+\theta-\frac{\Delta\theta}{2}\right)-\cos\left(\omega_0 t+\omega_1 t+\theta+\frac{\Delta\theta}{2}\right)\right] \end{array} \right\} - \frac{q(t)}{2} \cdot \left\{ \begin{array}{l} g \cdot \left[\sin\left(\omega_0 t-\omega_1 t-\theta+\frac{\Delta\theta}{2}\right)-\sin\left(\omega_0 t-\omega_1 t-\theta-\frac{\Delta\theta}{2}\right)\right]- \\ \frac{\Delta g}{2} \cdot \left[\sin\left(\omega_0 t-\omega_1 t-\theta+\frac{\Delta\theta}{2}\right)+\sin\left(\omega_0 t-\omega_1 t-\theta-\frac{\Delta\theta}{2}\right)\right]+ \\ g \cdot \left[\sin\left(\omega_0 t+\omega_1 t+\theta-\frac{\Delta\theta}{2}\right)+\sin\left(\omega_0 t+\omega_1 t+\theta+\frac{\Delta\theta}{2}\right)\right]- \\ \frac{\Delta g}{2} \cdot \left[\sin\left(\omega_0 t+\omega_1 t+\theta-\frac{\Delta\theta}{2}\right)-\sin\left(\omega_0 t+\omega_1 t+\theta+\frac{\Delta\theta}{2}\right)\right] \end{array} \right\} \tag{8}$$

$$m(t)=i(t) \cdot \left\{ \begin{array}{l} -g \cdot \sin(\omega_0 t-\omega_1 t-\theta)\sin\left(\frac{\Delta\theta}{2}\right)-\frac{\Delta g}{2} \cdot \cos(\omega_0 t-\omega_1 t-\theta) \cdot \cos\left(\frac{\Delta\theta}{2}\right)+ \\ g \cdot \cos(\omega_0 t+\omega_1 t+\theta)\sin\left(\frac{\Delta\theta}{2}\right)-\frac{\Delta g}{2} \cdot \sin(\omega_0 t+\omega_1 t+\theta) \cdot \sin\left(\frac{\Delta\theta}{2}\right) \end{array} \right\} - q(t) \cdot \left\{ \begin{array}{l} g \cdot \sin(\omega_0 t-\omega_1 t-\theta)\sin\left(\frac{\Delta\theta}{2}\right)-\frac{\Delta g}{2} \cdot \cos(\omega_0 t-\omega_1 t-\theta) \cdot \cos\left(\frac{\Delta\theta}{2}\right)+ \\ g \cdot \sin(\omega_0 t-\omega_1 t-\theta)\cos\left(\frac{\Delta\theta}{2}\right)+\frac{\Delta g}{2} \cdot \cos(\omega_0 t+\omega_1 t+\theta) \cdot \sin\left(\frac{\Delta\theta}{2}\right) \end{array} \right\}$$

By bringing in the carrier frequency $\omega_2=\omega_1+\omega_0$ and its image frequency $\omega_{-2}=\omega_1-\omega_0$:

$$m(t) = i(t)\cdot\left\{\begin{array}{c} g\cdot\sin(\omega_{-2}t+\theta)\sin\left(\frac{\Delta\theta}{2}\right)-\frac{\Delta g}{2}\cdot \\ \cos(\omega_{-2}t+\theta)\cos\left(\frac{\Delta\theta}{2}\right)+g\cdot\cos(\omega_2 t+\theta)\cos\left(\frac{\Delta\theta}{2}\right)- \\ \frac{\Delta g}{2}\cdot\sin(\omega_2 t+\theta)\sin\left(\frac{\Delta\theta}{2}\right)\end{array}\right\}- \tag{10}$$

$$-q(t)\cdot\left\{\begin{array}{c} g\cdot\cos(\omega_{-2}t+\theta)\sin\left(\frac{\Delta\theta}{2}\right)+ \\ \frac{\Delta g}{2}\cdot\sin(\omega_{-2}t+\theta)\cos\left(\frac{\Delta\theta}{2}\right)+ \\ g\cdot\sin(\omega_2 t+\theta)\cos\left(\frac{\Delta\theta}{2}\right)+ \\ \frac{\Delta g}{2}\cdot\cos(\omega_2 t+\theta)\sin\left(\frac{\Delta\theta}{2}\right)\end{array}\right\}$$

$$\begin{aligned} m(t) = {} & g\cdot\cos\left(\frac{\Delta\theta}{2}\right)\cdot[i(t)\cdot\cos(\omega_2 t+\theta)-q(t)\cdot\sin(\omega_2 t+\theta)]- \\ & \frac{\Delta g}{2}\sin\left(\frac{\Delta\theta}{2}\right)\cdot[i(t)\cdot\sin(\omega_2 t+\theta)+q(t)\cdot\cos(\omega_2 t+\theta)]+ \\ & g\cdot\sin\left(\frac{\Delta\theta}{2}\right)\cdot[i(t)\cdot\sin(\omega_{-2}t+\theta)-q(t)\cdot\cos(\omega_{-2}t+\theta)]- \\ & \frac{\Delta g}{2}\cdot\cos\left(\frac{\Delta\theta}{2}\right)\cdot[i(t)\cdot\cos(\omega_{-2}t+\theta)+q(t)\cdot\sin(\omega_{-2}t+\theta)] \end{aligned} \tag{11}$$

The resultant signal m(t) is therefore constituted by:

a wanted signal (modulated about the carrier $\omega_2$), weighted by a gain equal to $$g\cdot\cos\left(\frac{\Delta\theta}{2}\right);$$

an undesirable component, whose amplitude is of the order of $$\frac{\Delta g}{2}\cdot\sin\left(\frac{\Delta\theta}{2}\right);$$

an image in $\omega_{-2}$ (due to the imperfections), the power of which depends on the difference in gain $\Delta g$ and in phase $\Delta\theta$ between the two channels.

The result from equation (11) shows that the imperfections in gain and in phase generate a parasite component in $\omega_2$ of power sufficiently low to be easily filtered. Contrary to this, the imperfections have very little influence on the quality of the wanted signal.

If a gain error $\Delta g$=3% and a phase error (quadrature) $\Delta\theta$=3° are chosen, the C/I of the wanted signal (power of the signal/power of the interference at frequency $\omega_2$) is 68 dBc, instead of 28 dBc for an architecture with traditional direct conversion. The power level of the interference present at the image frequency $\omega_{-2}$ is about 28 dB below the wanted signal while it would be 25 times higher with a traditional frequency transposition structure.

Compared to the other architectures, this original system offers the following advantages:

an identical gain for the channels i(t) and q(t);

negligible degradation of the wanted signal ($\approx\Delta g\cdot\Delta\theta/4$);

a highly attenuated image frequency which can be suppressed with a relaxed constraint filter;

reduced complexity compared with a direct conversion transmitter thanks to signal processing being carried out in the digital domain.

Furthermore, passing through a first intermediate frequency FI($\omega_0$) generated in the digital domain enables one to attenuate any possible leakage from the conversion oscillator via the mixers.

2. SECOND EMBODIMENT: "SELF-CALIBRATING" IMAGE ANNULMENT

2.1 DESCRIPTION OF THE ARCHITECTURE

A second embodiment of a radiofrequency transmitter according to this invention will now be described with reference to FIG. 2.

In effect, in order to go further with the radiofrequency transmitter according to the invention it is proposed that gain and phase errors introduced in the direct conversion means 2 be compensated for digitally. Hence, at the output, the signal present at the image frequency will be completely attenuated.

This second embodiment differs from the first embodiment (described above with reference to FIG. 1) in that it additionally comprises means 10, 11 of digitally compensating for imperfections in gain $\Delta g$ and in phase $\Delta\theta$ of the direct conversion means 2. These compensation means themselves comprise means 10 of estimating the imperfections $\Delta g$ and $\Delta\theta$, and means 11 of applying a correction to the two signals $m_1(t)$ and $m_2(t)$ in a way that generates two corrected signals $m_{1c}(t)$ and $m_{2c}(t)$.

In the embodiment shown in FIG. 2, the means 10 of estimating the imperfections comprise:

transposition means 12, providing a third transposition in the analog domain, by multiplication of the resultant signal m(t) by the transmission frequency $\omega_1$, in a way that generates an intermediate signal: $m'_3(t)=g_3\cdot m(t)\cdot\cos(\omega_1 t+\theta_1)$, where $g_3$ is the gain introduced by the transposition means 12, the filtering means 13 and the analog/digital A/N conversion means 14.

a high stop filter 13, providing filtering of the intermediate signal $m'_3(t)$ and generating an intermediate filtered signal m'(t);

an analog/digital converter (CAN) 14, enabling one to convert the intermediate filtered signal m'(t) into digital;

means 15 of calculating imperfections in gain$\Delta g$ and in phase $\Delta\theta$ from the digital filtered intermediate signal m'(t).

It should be noted that the means 1 of transposition into intermediate frequency and of digital processing, the means 15 of calculating the imperfections and the means 11 of applying a correction to the two signals $m_1(t)$ and $m_2(t)$ can be included in one and the same digital signal processor (or DSP) 16.

The operation of this second embodiment of the radiofrequency transmitter can be broken down into three successive phases, namely;

recovery of the resultant transmitted signal m(t);

calculation of the correction coefficients $\Delta g$ and $\Delta\theta$;

calculation of the resultant corrected signal $m_c(t)$.

Theses three phases will now be described in succession, in paragraphs 2.2 to 2.4 respectively.

1.2 RECOVERY OF THE RESULTANT TRANSMITTED SIGNAL

The resultant signal m(t) is multiplied by the frequency $\omega_1$ of the conversion oscillator 7 (the latter is included in the direct conversion means 2). Hence m(t) is transposed to a lower fixed frequency, before analog/digital conversion.

The resultant signal is written:

$$m'_3(t) = g_3\cdot m(t)\cdot\cos\left(w_1 t+\theta-\frac{\Delta\theta}{2}\right)$$

By developing the product above and assuming that $g_3$=1, $m'_3(t)$ becomes:

$$
\begin{aligned}
m_3'(t) = {} & g\cdot\cos\left(\frac{\Delta\theta}{2}\right)\cdot\left\{\begin{array}{l}\frac{i(t)}{2}\cdot\left[\cos\left(\omega_0 t+\frac{\Delta\theta}{2}\right)+\cos\left(2\omega_1 t+\omega_0 t+2\theta-\frac{\Delta\theta}{2}\right)\right]-\\ \frac{q(t)}{2}\cdot\left[\sin\left(\omega_0 t+\frac{\Delta\theta}{2}\right)+\sin\left(2\omega_1 t+\omega_0 t+2\theta-\frac{\Delta\theta}{2}\right)\right]\end{array}\right\}- \\
& \frac{\Delta g}{2}\cdot\sin\left(\frac{\Delta\theta}{2}\right)\cdot\left\{\begin{array}{l}\frac{i(t)}{2}\cdot\left[\sin\left(\omega_0 t+\frac{\Delta\theta}{2}\right)+\sin\left(2\omega_1 t+\omega_0 t+2\theta-\frac{\Delta\theta}{2}\right)\right]+\\ \frac{q(t)}{2}\cdot\left[\cos\left(\omega_0 t+\frac{\Delta\theta}{2}\right)+\cos\left(2\omega_1 t+\omega_0 t+2\theta-\frac{\Delta\theta}{2}\right)\right]\end{array}\right\}+ \\
& g\cdot\sin\left(\frac{\Delta\theta}{2}\right)\cdot\left\{\begin{array}{l}\frac{i(t)}{2}\cdot\left[\sin\left(-\omega_0 t+\frac{\Delta\theta}{2}\right)+\sin\left(2\omega_1 t-\omega_0 t+2\theta-\frac{\Delta\theta}{2}\right)\right]-\\ \frac{q(t)}{2}\cdot\left[\cos\left(-\omega_0 t+\frac{\Delta\theta}{2}\right)+\cos\left(2\omega_1 t-\omega_0 t+2\theta-\frac{\Delta\theta}{2}\right)\right]\end{array}\right\}- \\
& \frac{\Delta g}{2}\cdot\cos\left(\frac{\Delta\theta}{2}\right)\cdot\left\{\begin{array}{l}\frac{i(t)}{2}\cdot\left[\cos\left(-\omega_0 t+\frac{\Delta\theta}{2}\right)+\cos\left(2\omega_1 t-\omega_0 t+2\theta-\frac{\Delta\theta}{2}\right)\right]+\\ \frac{q(t)}{2}\cdot\left[\sin\left(-\omega_0 t+\frac{\Delta\theta}{2}\right)+\sin\left(2\omega_1 t-\omega_0 t+2\theta-\frac{\Delta\theta}{2}\right)\right]\end{array}\right\}.
\end{aligned}
\tag{12}
$$

The high stop filtering (filter 13) suppresses the components $2\omega_1 t \pm \omega_0 t$ and gives:

$$
\begin{aligned}
m'(t) = {} & g\cdot\cos\left(\frac{\Delta\theta}{2}\right)\cdot\left[\frac{i(t)}{2}\cdot\cos\left(\omega_0 t+\frac{\Delta\theta}{2}\right)-\frac{q(t)}{2}\cdot\sin\left(\omega_0 t+\frac{\Delta\theta}{2}\right)\right]- \\
& \frac{\Delta g}{2}\cdot\sin\left(\frac{\Delta\theta}{2}\right)\cdot\left[\frac{i(t)}{2}\cdot\sin\left(\omega_0 t+\frac{\Delta\theta}{2}\right)+\frac{q(t)}{2}\cdot\cos\left(\omega_0 t+\frac{\Delta\theta}{2}\right)\right]- \\
& g\cdot\sin\left(\frac{\Delta\theta}{2}\right)\cdot\left[\frac{i(t)}{2}\cdot\sin\left(\omega_0 t-\frac{\Delta\theta}{2}\right)+\frac{q(t)}{2}\cdot\cos\left(\omega_0 t-\frac{\Delta\theta}{2}\right)\right]- \\
& \frac{\Delta g}{2}\cos\left(\frac{\Delta\theta}{2}\right)\cdot\left[\frac{i(t)}{2}\cdot\cos\left(\omega_0 t-\frac{\Delta\theta}{2}\right)-\frac{q(t)}{2}\cdot\sin\left(\omega_0 t-\frac{\Delta\theta}{2}\right)\right]
\end{aligned}
\tag{13}
$$

$$
\begin{aligned}
m'(t) = {} & g\cdot\cos\left(\frac{\Delta\theta}{2}\right)\cdot\left\{\begin{array}{l}\frac{i(t)}{2}\cdot\left[\cos(\omega_0 t)\cos\left(\frac{\Delta\theta}{2}\right)-\sin(\omega_0 t)\sin\left(\frac{\Delta\theta}{2}\right)\right]-\\ \frac{q(t)}{2}\cdot\left[\sin(\omega_0 t)\cos\left(\frac{\Delta\theta}{2}\right)+\cos(\omega_0 t)\sin\left(\frac{\Delta\theta}{2}\right)\right]\end{array}\right\}- \\
& \frac{\Delta g}{2}\cdot\sin\left(\frac{\Delta\theta}{2}\right)\cdot\left\{\begin{array}{l}\frac{i(t)}{2}\cdot\left[\sin(\omega_0 t)\cos\left(\frac{\Delta\theta}{2}\right)+\cos(\omega_0 t)\sin\left(\frac{\Delta\theta}{2}\right)\right]+\\ \frac{q(t)}{2}\cdot\left[\cos(\omega_0 t)\cos\left(\frac{\Delta\theta}{2}\right)-\sin(\omega_0 t)\sin\left(\frac{\Delta\theta}{2}\right)\right]\end{array}\right\}- \\
& g\cdot\sin\left(\frac{\Delta\theta}{2}\right)\cdot\left\{\begin{array}{l}\frac{i(t)}{2}\cdot\left[\sin(-\omega_0 t)\cos\left(\frac{\Delta\theta}{2}\right)-\cos(\omega_0 t)\sin\left(\frac{\Delta\theta}{2}\right)\right]+\\ \frac{q(t)}{2}\cdot\left[\cos(-\omega_0 t)\cos\left(\frac{\Delta\theta}{2}\right)+\sin(\omega_0 t)\sin\left(\frac{\Delta\theta}{2}\right)\right]\end{array}\right\}- \\
& \frac{\Delta g}{2}\cdot\cos\left(\frac{\Delta\theta}{2}\right)\cdot\left\{\begin{array}{l}\frac{i(t)}{2}\cdot\left[\cos(-\omega_0 t)\cos\left(\frac{\Delta\theta}{2}\right)+\sin(\omega_0 t)\sin\left(\frac{\Delta\theta}{2}\right)\right]-\\ \frac{q(t)}{2}\cdot\left[\sin(-\omega_0 t)\cos\left(\frac{\Delta\theta}{2}\right)-\cos(\omega_0 t)\sin\left(\frac{\Delta\theta}{2}\right)\right]\end{array}\right\}
\end{aligned}
\tag{14}
$$

$$
\begin{aligned}
m'(t) = {} & g\cdot\left\{\begin{array}{l}\frac{i(t)}{2}\cdot\left[\cos(\omega_0 t)\cos^2\left(\frac{\Delta\theta}{2}\right)-\sin(\omega_0 t)\frac{\sin(\Delta\theta)}{2}\right]-\\ \frac{q(t)}{2}\cdot\left[\sin(\omega_0 t)\cos^2\left(\frac{\Delta\theta}{2}\right)+\cos(\omega_0 t)\frac{\sin(\Delta\theta)}{2}\right]\end{array}\right\}- \\
& \frac{\Delta g}{2}\cdot\left\{\begin{array}{l}\frac{i(t)}{2}\cdot\left[\sin(\omega_0 t)\frac{\sin(\Delta\theta)}{2}+\cos(\omega_0 t)\sin^2\left(\frac{\Delta\theta}{2}\right)\right]+\\ \frac{q(t)}{2}\cdot\left[\cos(\omega_0 t)\frac{\sin(\Delta\theta)}{2}-\sin(\omega_0 t)\sin^2\left(\frac{\Delta\theta}{2}\right)\right]\end{array}\right\}- \\
& g\cdot\left\{\begin{array}{l}\frac{i(t)}{2}\cdot\left[\sin(\omega_0 t)\frac{\sin(\Delta\theta)}{2}-\cos(\omega_0 t)\sin^2\left(\frac{\Delta\theta}{2}\right)\right]+\\ \frac{q(t)}{2}\cdot\left[\cos(\omega_0 t)\frac{\sin(\Delta\theta)}{2}+\sin(\omega_0 t)\sin^2\left(\frac{\Delta\theta}{2}\right)\right]\end{array}\right\}- \\
& \frac{\Delta g}{2}\cdot\left\{\begin{array}{l}\frac{i(t)}{2}\cdot\left[\cos(\omega_0 t)\cos^2\left(\frac{\Delta\theta}{2}\right)+\sin(\omega_0 t)\frac{\sin(\Delta\theta)}{2}\right]-\\ \frac{q(t)}{2}\cdot\left[\sin(\omega_0 t)\cos^2\left(\frac{\Delta\theta}{2}\right)-\cos(\omega_0 t)\frac{\sin(\Delta\theta)}{2}\right]\end{array}\right\}
\end{aligned}
\tag{15}
$$

-continued $$m'(t) = g\cdot\left\{\frac{i(t)}{2}\cdot[\cos(\omega_0 t) - \sin(\omega_0 t)\sin(\Delta\theta)] - \frac{q(t)}{2}\cdot[\sin(\omega_0 t) + \cos(\omega_0 t)\sin(\Delta\theta)]\right\} - \frac{\Delta g}{2}\cdot\left\{\frac{i(t)}{2}\cdot[\cos(\omega_0 t) + \sin(\omega_0 t)\sin(\Delta\theta)] - \frac{q(t)}{2}\cdot[\sin(\omega_0 t) - \cos(\omega_0 t)\sin(\Delta\theta)]\right\} \tag{16}$$

$$m'(t) = \left\{\frac{i(t)}{2}\cdot\left[g - \frac{\Delta g}{2}\right] - \frac{q(t)}{2}\left[g + \frac{\Delta g}{2}\right]\sin(\Delta\theta)\right\}\cdot\cos(\omega_0 t) - \left\{\frac{i(t)}{2}\cdot\left[g + \frac{\Delta g}{2}\right]\sin(\Delta\theta) + \frac{q(t)}{2}\left[g - \frac{\Delta g}{2}\right]\right\}\cdot\sin(\omega_0 t) \tag{17}$$

$$m'(t) = i'(t)\cdot\cos(\omega_0 t) - q'(t)\cdot\sin(\omega_0 t) \text{ with } \begin{cases} i'(t) = a\cdot i(t) - b\cdot q(t) \\ q'(t) = b\cdot i(t) + a\cdot q(t) \end{cases} \tag{18}$$

$$a = \frac{2g - \Delta g}{4},\ b = \frac{2g + \Delta g}{4}\sin(\Delta\theta)$$

From equation (18), one seeks to extract the coefficients 'a' and 'b' so as to deduce from it the values of $\Delta g$ and $\Delta\theta$. Knowing that $i^2(t)+q^2(t)=1$, one has $$a = i(t)\cdot i'(t) + q(t)\cdot q'(t)$$

$$b = i(t)\cdot q'(t) - q(t)\cdot i'(t) \tag{19}$$

In the real case where $g_3 \neq 0$, the coefficients 'a' and 'b' are written:

$$a = g_3\cdot\frac{2g - \Delta g}{4} \text{ and } b = g_3\cdot\frac{2g + \Delta g}{4}\sin(\Delta\theta) \tag{20}$$

1.3 CALCULATION OF THE CORRECTION COEFFICIENTS

Knowing the theoretical values of the gains 'g' and '$g_3$', one can calculate $\Delta g$, $\Delta\theta$ and the real value of $g_3$ from the coefficients 'a' and 'b'. Equation (20) gives us:

$$a + b = \frac{g_3}{4}[2g(1 + \sin\Delta\theta) - \Delta g(1 - \sin\Delta\theta)] \tag{21}$$

Assuming that, in a first approximation, $\sin\Delta\theta \approx 0$ and $\Delta g \ll g$, an estimation of the gain $g_3$ can be deduced:

$$g_3' = \frac{2(a + b)}{g} = \frac{2}{g}[i'(t) + q'(t)][i(t) - q(t)] \tag{22}$$

On keeping the approximation $\sin\Delta\theta \approx 0$ and knowing the theoretical value for $g_3$, one can rapidly determine $\Delta g$:

$$\Delta g \approx \frac{2g}{g_3}(g_3 - g_3') = 2g - \frac{4}{g_3}[i'(t) + q'(t)][i(t) - q(t)] \tag{23}$$

On introducing the gain calculated in (22), the coefficient $\Delta\theta$ is deduced from equation (20) with the hypothesis that $\sin\Delta\theta \approx \Delta\theta$ and $\Delta g\cdot\sin\Delta\theta \approx 0$:

$$\Delta\theta \approx \frac{b}{g\cdot g_3} = \frac{1}{g\cdot g_3}[i(t)\cdot q'(t) - q(t)\cdot i'(t)] \tag{24}$$

By choosing values to the value 2 for the theoretical gains 'g' and 'g3', the calculation of the correction coefficients is simplified, avoiding an expensive division in silicon.

1.4 CALCULATION OF THE RESULTANT CORRECTED SIGNAL

After calculation of the correction coefficients $\Delta g$ and $\Delta\theta$, the new corrected transmission signal $m_c(t)$ must be constructed:

$$m_c(t) = m_{1c}(t)\cdot\left(g - \frac{\Delta g}{2}\right)\cos\left(\omega_1 t + \theta - \frac{\Delta\theta}{2}\right) + m_{2c}(t)\cdot\left(g + \frac{\Delta g}{2}\right)\sin\left(\omega_1 t + \theta + \frac{\Delta\theta}{2}\right) \tag{25}$$

where $m_{1c}(t)$ and $m_{2c}(t)$ are the two channels corrected for gain and phase:

$$m_{1c}(t) = \frac{1}{\left(1 + \frac{\Delta g}{2g}\right)}\left[i(t)\cdot\cos\left(\omega_0 t - \frac{\Delta\theta}{2}\right) - q(t)\cdot\sin\left(\omega_0 t - \frac{\Delta\theta}{2}\right)\right]$$

$$m_{2c}(t) = \frac{-1}{\left(1 + \frac{\Delta g}{2g}\right)}\left[i(t)\cdot\cos\left(\omega_0 t + \frac{\Delta\theta}{2}\right) + q(t)\cdot\sin\left(\omega_0 t + \frac{\Delta\theta}{2}\right)\right] \tag{26}$$

By developing equation (25) one arrives at:

$$m_c(t) = i(t)\cdot\cos\left(\omega_1 t + \theta - \frac{\Delta\theta}{2}\right)\cdot\cos\left(\omega_1 t - \frac{\Delta\theta}{2}\right) - q(t)\cdot\cos\left(\omega_1 t + \theta - \frac{\Delta\theta}{2}\right)\cdot\sin\left(\omega_1 t - \frac{\Delta\theta}{2}\right) - i(t)\cdot\sin\left(\omega_1 t + \theta + \frac{\Delta\theta}{2}\right)\cdot\sin\left(\omega_1 t + \frac{\Delta\theta}{2}\right) - q(t)\cdot\sin\left(\omega_1 t + \theta + \frac{\Delta\theta}{2}\right)\cdot\cos\left(\omega_1 t + \frac{\Delta\theta}{2}\right) \tag{27}$$

$$m_c(t) = \frac{i(t)}{2}[\cos(\omega_1 t - \omega_0 t + \theta) + \cos(\omega_1 t + \omega_0 t + \theta - \Delta\theta)] + \frac{q(t)}{2}[\sin(\omega_1 t - \omega_0 t + \theta) + \sin(\omega_1 t + \omega_0 t + \theta - \Delta\theta)] - \frac{i(t)}{2}[\cos(\omega_1 t - \omega_0 t + \theta) - \cos(\omega_1 t + \omega_0 t + \theta + \Delta\theta)] - \frac{q(t)}{2}[\sin(\omega_1 t - \omega_0 t + \theta) + \sin(\omega_1 t + \omega_0 t + \theta + \Delta\theta)] \tag{28}$$

$$m_c(t) = \frac{i(t)}{2}[\cos(\omega_1 t + \omega_0 t + \theta - \Delta\theta) + \cos(\omega_1 t + \omega_0 t + \theta + \Delta\theta)] - \frac{q(t)}{2}[\sin(\omega_1 t + \omega_0 t + \theta - \Delta\theta) + \sin(\omega_1 t + \omega_0 t + \theta + \Delta\theta)] \tag{29}$$

$$m_c(t) = [i(t)\cos(\omega_1 t + \omega_0 t + \theta) - q(t)\sin(\omega_1 t + \omega_0 t + \theta)]\cos\Delta\theta \tag{30}$$

By again substituting $\omega_2 = \omega_1 + \omega_0$, one again finds the expression for the signal m(t) formulated in the ideal case (equation 4), with g=1). The correction system is simplified without degrading the signal quality since this again is applied to both channels i(t) and q(t). If $\Delta\theta=5°$, the resultant error is about 0.4% on the amplitude of the transmitted signal.

The simplified expression for the two channels $m_{1c}(t)$ and $m_{2c}(t)$ corrected for gain and for phase is written:

$$m_{1c}(t) = \left(1 + \frac{\Delta g}{2g}\right)\cdot\left[i(t)\cdot\cos\left(\omega_0 t - \frac{\Delta\theta}{2}\right) - q(t)\cdot\sin\left(\omega_0 t - \frac{\Delta\theta}{2}\right)\right] \quad (31)$$

$$m_{2c}(t) = -\left(1 + \frac{\Delta g}{2g}\right)\cdot\left[i(t)\cdot\sin\left(\omega_0 t + \frac{\Delta\theta}{2}\right) + q(t)\cdot\sin\left(\omega_0 t + \frac{\Delta\theta}{2}\right)\right]$$

In other words the means 11 of applying a correction to the two signals $m_1(t)$ and $m_2(t)$ apply:

to the first channel: a gain equal to $(1+\Delta g/2g)$ and a phase shift equal to $(-\Delta\theta/2)$;

to the second channel: a gain equal to $(1-\Delta g/2g)$ and a phase shift equal to $(+\Delta\theta/2)$.

In this way all division operations for the calculation of the corrected signal are avoided; within the hypothesis where the theoretical value for the gain 'g' is chosen in such a way that it is a multiple of a power of 2.

The algorithms for calculating $\Delta g$ and $\Delta\theta$ have been successfully simulated: the error is compensated after 5 iterations at the most, according to the orders of magnitude of $\Delta g$ and $\Delta\theta$ (up to 10% and 8° respectively) and with an error ranging up to 12% on the value of $g_3$.

Throughout the detailed description above of two particular embodiments, the new architecture of a radiofrequency transmitter according to this invention has been described.

It will be recalled that it combines the advantages of a transmitter with direct conversion (no image frequency) without having its disadvantages (no degradation of the wanted signal). Thanks to the self-calibrating system, the errors, introduced through the analog part sensitive to the imperfections, are compensated for in the digital domain. Hence the resultant signal which is transmitted has characteristics close to the ideal case.

The signal processing functions are carried out in the digital domain so as to exploit the precision and the high degree of integration on silicon. The analog/digital converter (CAN) 14 is, for example of the "delta-sigma pass band" type, whose working frequency is preferably identical to that of the two digital/analog converters $\mathbf{5}_1$ and $\mathbf{5}_2$. The analog high stop filter 13 has relaxed constraints: a filter of order 2 is sufficient in most cases.

The radiofrequency transmitter according to the invention provides relatively low complexity compared with the remainder of the transmission chain and has the advantage of being able to be completely integrated on silicon.

What is claimed is:

1. Radiofrequency transmitter, of the type supplied with two signals in base band and in quadrature, i(nT) and q(nT), which are images from two binary streams representing information to be transmitted, the radiofrequency transmitter:

means (1) of transposition into an intermediate frequency and of digital processing, that provide a first transposition into the digital domain, at an intermediate frequency $\omega_0$, for said base band signals, and generating, by combination, two signals at the intermediate frequency and in quadrature;

means (2) of direct conversion, providing a second transposition into the analog domain, after multiplication by a frequency $\omega_1$, followed by a summation, of said two signals at the intermediate frequency and in quadrature, in a way that generates a resultant signal which is finally modulated around a frequency $\omega_2$, where $\omega_2=\omega_0+\omega_1$ wherein said two signals at the intermediate frequency and in quadrature are of the form:

$m_1(t)=i(t)\cdot\cos(\omega_0 t)-q(t)\cdot\cos(\omega_0 t)$ $m_2(t)=-i(t)\cdot\sin(\omega_0 t)-q(t)\cdot\cos(\omega_0 t)$ and in that said resultant signal is of the form $m(t)=g_1\cdot m_1(t)\cdot\cos(\omega_1 t+\theta_1)+g_2\cdot m_2(t)\cdot\sin(\omega_1 t+\theta_2)$ where $g_1$ and $g_2$ are the respective gains for the two channels in quadrature of said means of direct conversion $\theta_1$ and $\theta_2$ are the respective phase shifts for the two channels in quadrature of said means of direct conversion.

2. Radiofrequency transmitter according to claim 1 characterized in that it is produced in the form of an integrated circuit.

3. Radiofrequency transmitter according to claim 1 it additionally comprising filtering means (17) that receive and filter said resultant signal, in a way that suppresses, at least in part, a parasitic component of said resultant signal, at the image frequency $\omega_{-2}$.

4. Radiofrequency transmitter according to claim 2, at least a part of said filtering means (17) is included in said integrated circuit.

5. Radiofrequency transmitter of the type supplied with two signals in base band and in quadrature, i(nT) and q(nT), which are images from two binary streams representing information to be transmitted, the radiofrequency transmitter:

means (1) of transposition into an intermediate frequency and of digital processing, that provide a first transposition into the digital domain, at an intermediate frequency $\omega_0$, for said base band signals, and generating, by combination, two signals at the intermediate frequency and in quadrature;

means (2) of direct conversion, providing a second transposition into the analog domain, after multiplication by a frequency $\omega_1$, followed by a summation, of said two signals at the intermediate frequency and in quadrature, in a way that generates a resultant signal which is finally modulated around a frequency $\omega_2$, where $\omega_2=\omega_0+\omega_1$ means (10, and 11) of digitally compensating for imperfections in gain and in phase of said means of direct conversion means (10 of estimating the imperfections in gain $\Delta g$ and in phase $\Delta\theta$ of said means of direct conversion with, $$\Delta g=g_2-g_1$$

$$\Delta\theta=\theta_2-\theta_1$$

means (11) of applying a correction to said [tow] *two* signals at the intermediate frequency and in quadrature, in a way that generates two corrected signals, $m_{1c}(t)$ and $m_{2c}(t)$ at the intermediate frequency and in quadrature, the corresponding resultant corrected signal being written:

$$m_c(t)=g_1\cdot m_{1c}(t)\cdot\cos(\omega_1 t+\theta_1)+g_2\cdot m_{2c}(t)\cdot\sin(\omega_1 t+\theta_2).$$

6. Radiofrequency transmitter according to claim 5, wherein said means (10) of estimating imperfections comprise:

transportation means (12), that provide a third transposition in the analog domain, by multiplication of the resultant signal by said transmission frequency $\omega_1$ in a way that generates the following intermediate signal:

$$m'_3(t)=g_3\cdot m(t)\cdot\cos(\omega_1 t+\theta_1),$$

where $g_3$ is the gain introduced by said transposition means (12), said filtering means (13) and said analog/digital A/N conversion means (14);

high stop filtering means (13), providing filtration of the intermediate signal and generating an intermediate filtered signal m'(t);

analog/digital conversion means (14), enabling one to convert the intermediate filtered signal m'(t) into digital;

means (15) of calculating imperfections in gain $\Delta g$ and in phase $\Delta\theta$ from the digital filtered intermediate signal by said means of analog/digital conversion.

7. Radiofrequency transmitter according to claim 6, wherein said means (15) of calculating imperfections in gain $\Delta g$ and in phase $\Delta\theta$ comprise:

means of transforming said digital filtered intermediate signal in the for:

$$m'(t)=i'(t)\cdot\cos(\omega_0 t)-q'(t)\cdot\sin(\omega_0 t)$$

and in that the imperfections in gain $\Delta g$ and in phase $\Delta\theta$ are estimated in accordance with the following formulae;

$$\Delta g=2g-(4/g_3)\cdot[i'(t)+q'(t)]\cdot[i(t)-q(t)]$$

$$\Delta\theta=(1/g\cdot g_3)\cdot[i(t)\cdot q'(t)-q(t)i'(t)].$$

8. Radiofrequency transmitter according to claim 6, wherein said gains g and $g_3$ have values of power 2.

9. Radio frequency transmitter according to claim 5, wherein said two corrected signals, at the intermediate frequency and in quadrature, are written in the following simplified form:

$$m_{1c}(t)=(1+(\Delta g/2g))\cdot[i(t)\cdot\cos(\omega_0 t-(\Delta\theta/2))-q(t)\cdot\sin(\omega_0 t-(\Delta\theta/2))]$$

$$m_{2c}(t)=-(1-(\Delta g/2g))\cdot[i(t)\cdot\sin(\omega_0 t-(\Delta\theta/2))-q(t)\cdot\cos(\omega_0 t+(\Delta\theta/2))].$$

10. [Radiofrequncy] *Radiofrequency* transmitter according to claim 6, wherein said means (14) of analog/digital conversion have a working frequency substantially identical to the working frequency of means (5$_1$, 5$_2$) of digital/analog conversion included in said means (2) of direct conversion.

11. Radiofrequency transmitter according to claim 2, additionally comprising means (10, and 11) of digitally compensating for imperfections in gain and in phase of said means of direct conversion, said means (10, 11) of digital compensation being included in said integrated circuit.

*12. A radiofrequency transmitter configured to receive signals in baseband and in quadrature, wherein the signals comprise images from two binary streams representing information to be transmitted, the radiofrequency transmitter comprising:*

*means for transpositioning the signals into an intermediate frequency, wherein the transpositioning means is configured to provide the signals both at the intermediate frequency and in quadrature;*

*means for converting the signals as the intermediate frequency and in quadrature into the analog domain, wherein the converting means is configured to multiply the signals by a frequency $\omega_1$, sum the signals at the intermediate frequency and in quadrature, and generate a resultant signal modulated around a frequency $\omega_2$, where $\omega_2=\omega_0+\omega_1$;*

*wherein the signals at the intermediate frequency and in quadrature comprise the form:*

$$m_1(t)=i(t)\cdot\cos(\omega_0 t)-q(t)\cdot\sin(\omega_0 t)$$

$$m_2(t)=-i(t)\cdot\sin(\omega_0 t)-q(t)\cdot\cos(\omega_0 t);\ \text{and}$$

*wherein the resultant signal comprises the form:*

$$m(t)=g_1\cdot m_1(t)\cdot\cos(\omega_1 t+\theta_1)+g_2\cdot m_2(t)\cdot\sin(\omega_1 t+\theta_2),$$

*where:*

*$g_1$ and $g_2$ comprise gains for channels in quadrature of the converting means; and*

*$\theta_1$ and $\theta_2$ are the respective phase shifts for the channels in quadrature of the converting means.*

*13. The radiofrequency transmitter of claim 12, wherein one or more of the transpositioning means or the converting means, or combinations thereof, are disposed in an integrated circuit.*

*14. The radiofrequency transmitter of claim 12, further comprising means for filtering the signals, wherein a parasitic component signal is at least partially suppressed at an image frequency.*

*15. A radiofrequency transmitter of claim 14, wherein the filtering means is at least partially disposed in an integrated circuit.*

*16. A radiofrequency transmitter configured to receive signals in baseband and in quadrature, wherein the signals comprise images from two binary streams representing information to be transmitted, the radiofrequency transmitter comprising:*

*means for transpositioning the signals into an intermediate frequency, wherein the transpositioning means is configured to provide the signals both at the intermediate frequency and in quadrature;*

*means for converting the signals as the intermediate frequency and in quadrature into the analog domain, wherein the converting means is configured to multiply the signals by a frequency $\omega_1$, sum the signals at the intermediate frequency and in quadrature, and generate a resultant signal modulated around a frequency $\omega_2$, where $\omega_2=\omega_0+\omega_1$;*

*means for compensating for imperfections in gain or in phase, or combinations thereof, of the converting means;*

*means for estimating the imperfections in gain $\Delta g$ or in phase $\Delta\theta$, or combinations thereof, of the converting means where:*

$$\Delta g=g_2-g_1;\ \text{and}$$

$$\Delta\theta=\theta_2-\theta_1;\ \text{and}$$

*means for correcting the signals at the intermediate frequency and in quadrature, wherein the correcting means is configured to generate corrected signals, $m_{1c}(t)$ and $m_{2c}(t)$, at the intermediate frequency and in quadrature, and wherein the corrected signals have the form:*

$$m_c(t)=g_1\cdot m_{1c}(t)\cdot\cos(\omega_1 t+\theta_1)+g_2\cdot m_{2c}(t)\cdot\sin(\omega_1 t+\theta_2).$$

17. The radiofrequency transmitter of claim 16, wherein the estimating means comprises:

means for multiplying an output of the transpositioning means by a transmission frequency $\omega_1$ to provide an intermediate signal;

means for filtering the intermediate signal to generate an intermediate filtered signal $m'(t)$;

means for converting an analog signal into a digital signal, wherein the analog-to-digital converting means is configured to convert the intermediate filtered signal $m'(t)$ into a digital filtered intermediate signal; and means for calculating imperfections in gain or in phase, or combinations thereof, from the digital filtered intermediate signal by the analog-to-digital converting means;

wherein:

$$m'_3(t)=g_3\cdot m(t)\cdot cos(\omega_1 t+\theta_1),$$

where $g_3$ is a gain introduced by one of the multiplying means, the filtering means, or the analog-to-digital converting means, or combinations thereof.

18. The radiofrequency transmitter of claim 17, wherein the means for calculating imperfections in gain or in phase, or combinations thereof, comprises:

means for transforming the digital filtered intermediate signal as:

$$m'(t)=i'(t)\cdot cos(\omega_0 t)-q'(t)\cdot sin(\omega_0 t);$$

wherein the means for calculating imperfections in gain or in phase, or combinations thereof, is configured to estimate imperfections in gain $\Delta g$ or in phase $\Delta\theta$, or combinations thereof, as:

$$\Delta g=2g-(4/g_3)\cdot[i'(t)+q'(t)]\cdot[i(t)-q(t)]$$

$$\Delta\theta=(1/g\cdot g_3)\cdot[i(t)\cdot q'(t)-q(t)i'(t)].$$

19. The radiofrequency transmitter of claim 17, wherein the gains g and $g_3$ have values of exponents of the power 2.

20. The radiofrequency transmitter of claim 16, wherein the corrected signals, at the intermediate frequency and in quadrature, are configured to be represented as:

$$m_{1c}(t)=(1+(\Delta g/2g))\cdot[i(t)\cdot cos(\omega_0 t-(\Delta\theta/2))-q(t)\cdot sin(\omega_0 t-(\Delta\theta/2))]$$

$$m_{2c}(t)=-(1-(\Delta g/2g))\cdot[i(t)\cdot sin(\omega_0 t-(\Delta\theta/2))-q(t)\cdot cos(\omega_0 t+(\Delta\theta/2))].$$

21. The radiofrequency transmitter of claim 17, wherein the analog-to-digital converting means comprises a working frequency substantially identical to the working frequency of the transpositioning means or the converting means, or combinations thereof.

22. The radiofrequency transmitter of claim 13, further comprising means for compensating for imperfections in gain or in phase, or combinations thereof, of an output from the converting means.

23. A method, comprising:

receiving signals in baseband and in quadrature, wherein the signals comprise images from two binary streams representing information to be transmitted;

transpositioning the signals into an intermediate frequency to provide the signals at both the intermediate frequency and in quadrature; and converting the signals at the intermediate frequency and in quadrature into the analog domain, wherein said converting comprises multiplying the signals by a frequency $\omega_1$, summing the signals at the intermediate frequency and in quadrature, and generating a resultant signal modulated around a frequency $\omega_2$, where $\omega_2=\omega_0+\omega_1$;

wherein the signals at the intermediate frequency and in quadrature comprise the form:

$$m_1(t)=i(t)\cdot cos(\omega_0 t)-q(t)\cdot sin(\omega_0 t)$$

$$m_2(t)=-i(t)\cdot sin(\omega_0 t)-q(t)\cdot cos(\omega_0 t);\text{ and}$$

wherein the resultant signal comprises the form:

$$m(t)=g_1\cdot m_1(t)\cdot cos(\omega_1 t+\theta_1)+g_2\cdot m_2(t)\cdot sin(\omega_1 t+\theta_2)$$

where:

$g_1$ and $g_2$ comprise gains for channels in quadrature of said converting; and $\theta_1$ and $\theta_2$ are the respective phase shifts for the channels in quadrature of said converting.

24. The method of claim 12, further comprising filtering the signals, wherein a parasitic component signal is at least partially suppressed at an image frequency.

25. A radiofrequency transmitter, comprising:

a first circuit configured to generate an intermediate frequency signal from signals in baseband and in quadrature, wherein the intermediate frequency signal is a digital signal; and a second circuit configured to convert the intermediate frequency signal from a digital signal into a resultant analog signal to be transmitted;

wherein the first circuit is configured to generate the intermediate frequency signal in a form so that, if converted by the second circuit, an image signal at an output of the second circuit is sufficiently attenuated without requiring filtering of the image signal;

wherein the intermediate frequency signal and the in quadrature signal comprise the form:

$$m_1(t)=i(t)\cdot cos(\omega_0 t)-q(t)\cdot sin(\omega_0 t)$$

$$m_2(t)=-i(t)\cdot sin(\omega_0 t)-q(t)\cdot cos(\omega_0 t);\text{ and}$$

wherein the resultant signal is of the form:

$$m(t)=g_1\cdot m_1(t)\cdot cos(\omega_1 t+\theta_1)+g_2\cdot m_2(t)\cdot sin(\omega_1 t+\theta_2)$$

where:

$g_1$ and $g_2$ comprise gains for channels in quadrature of the second circuit; and $\theta_1$ and $\theta_2$ are the respective phase shifts for the channels in quadrature of the second circuit.

26. The radiofrequency transmitter of claim 25, wherein one or more of the first circuit or second circuits, or combinations thereof, are disposed in an integrated circuit.

27. The radiofrequency transmitter of claim 25, further comprising a filter configured to at least partially suppress parasitic component signals at an image frequency.

28. The radiofrequency transmitter of claim 27, wherein the filter is at least partially disposed in an integrated circuit.

* * * * *

UNITED STATES PATENT AND TRADEMARK OFFICE

CERTIFICATE OF CORRECTION

PATENT NO. : RE42,043 E
APPLICATION NO. : 11/318388
DATED : January 18, 2011
INVENTOR(S) : Andre It is certified that error appears in the above-identified patent and that said Letters Patent is hereby corrected as shown below:

Title page, item (57), under "Abstract", in Column 2, Line 2, delete "I(nT)" and insert -- i(nT) --.

Column 14, line 7, in Claim 1, delete "$q(t)\cdot\cos(\omega_0 t)$" and insert -- $q(t)\cdot\sin(\omega_0 t)$ --.

Column 14, line 49, in Claim 5, delete "(10" and insert -- (10) --.

Column 15, line 1, in Claim 6, delete "transportation" and insert -- transposition --.

Column 15, line 24, in Claim 7, delete "for:" and insert -- form: --.

Column 16, line 30, in Claim 15, before "*radiofrequency*" delete "*A*" and insert -- *The* --.

Column 16, line 33, in Claim 16, delete "*transmitter*" and insert -- *transmitter*, --.

Column 18, line 23, in Claim 24, delete "*claim 12*," and insert -- *claim 23*, --.

Column 18, line 40, in Claim 25, delete "*the in*" and insert -- *in* --.

Column 18, line 58, in Claim 26, delete "*circuits*," and insert -- *circuit*, --.

Signed and Sealed this
Twelfth Day of June, 2012

David J. Kappos

David J. Kappos
*Director of the United States Patent and Trademark Office*